US012476547B2

(12) United States Patent
Takahashi

(10) Patent No.: US 12,476,547 B2
(45) Date of Patent: Nov. 18, 2025

(54) POWER CONVERSION DEVICE WITH SEMICONDUCTOR TEMPERATURE PROTECTION

(71) Applicant: Mitsubishi Electric Corporation, Tokyo (JP)

(72) Inventor: Yuya Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 351 days.

(21) Appl. No.: 18/072,233

(22) Filed: Nov. 30, 2022

(65) Prior Publication Data
US 2023/0421068 A1 Dec. 28, 2023

(30) Foreign Application Priority Data
Jun. 28, 2022 (JP) .................... 2022-103278

(51) Int. Cl.
*H02M 3/00* (2006.01)
*H02M 1/32* (2007.01)
*H02M 3/335* (2006.01)

(52) U.S. Cl.
CPC ....... *H02M 3/33573* (2021.05); *H02M 1/327* (2021.05); *H02M 3/003* (2021.05)

(58) Field of Classification Search
CPC .. H05K 7/20; H05K 7/20218; H05K 7/20845; H05K 7/20954; H05K 7/2089; H05K 7/20872; H05K 7/20881; H05K 7/20927; H05K 7/20936; H05K 7/20945; H03K 17/12; H03K 17/16; H03K 17/687; H02M 1/00; H02M 1/08; H02M 1/327;
(Continued)

(56) References Cited

U.S. PATENT DOCUMENTS

| 2011/0188204 A1* | 8/2011 | Horiuchi ............ H05K 7/20927 29/527.1 |
| 2023/0164958 A1 | 5/2023 | Yoshimi et al. |
| 2024/0203826 A1* | 6/2024 | Byers ................ H01L 23/49537 |

FOREIGN PATENT DOCUMENTS

| DE | 102012223369 A1 * | 3/2014 | .......... H02M 3/3376 |
| JP | 2005-286270 A | 10/2005 | |

(Continued)

OTHER PUBLICATIONS

Office Action issued Jul. 22, 2025 in Japanese Application No. 2022-103278.

*Primary Examiner* — Thienvu V Tran
*Assistant Examiner* — Shahzeb K Ahmad
(74) *Attorney, Agent, or Firm* — Sughrue Mion, PLLC

(57) ABSTRACT

The power conversion device includes a transformer having primary and secondary windings, an inverter circuit that carries out a supply of power to the primary winding, a rectifying circuit that rectifies power from the secondary winding, a cooler that cools semiconductor elements configuring the inverter circuit and semiconductor elements configuring the rectifying circuit, and a temperature detector that detects a temperature of the semiconductor elements configuring the inverter circuit and the semiconductor elements configuring the rectifying circuit. The cooler has a refrigerant channel along which a refrigerant is caused to circulate, the inverter circuit, the rectifying circuit, and the temperature detector are disposed above the refrigerant channel, and the temperature detector is disposed neighboring at least either one of the inverter circuit or the rectifying circuit.

18 Claims, 10 Drawing Sheets

(58) Field of Classification Search
CPC ........ H02M 3/003; H02M 3/28; H02M 3/335;
H02M 3/33507; H02M 3/33573; H02M
7/003; H02M 7/48; H02H 5/04
See application file for complete search history.

(56) References Cited

FOREIGN PATENT DOCUMENTS

| | | |
|---|---|---|
| JP | 2008-220042 A | 9/2008 |
| JP | 4725536 B2 * | 7/2011 |
| JP | 6277114 B2 * | 2/2018 |
| JP | 6601311 B2 * | 11/2019 |
| WO | 2021/235485 A1 | 11/2021 |

* cited by examiner

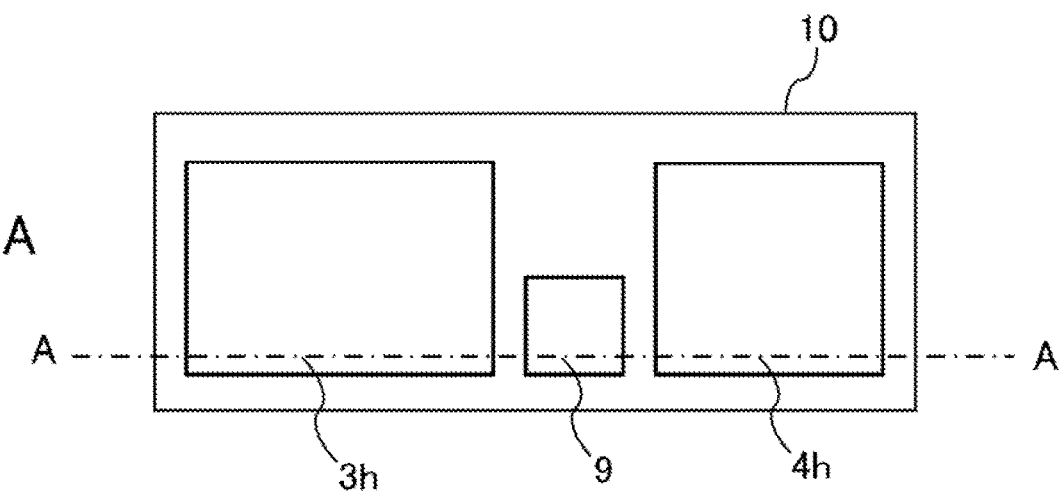
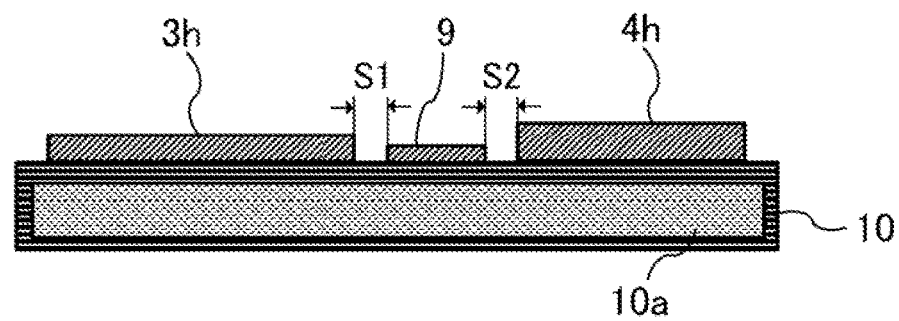

POWER CONVERSION DEVICE WITH SEMICONDUCTOR TEMPERATURE PROTECTION

BACKGROUND OF THE INVENTION

Field of the Invention

The present application relates to the field of a power conversion device.

Description of the Related Art

A vehicle-mounted power conversion device such as an inverter or a converter is configured of semiconductor elements such as switching elements or diodes, and generates heat due to a large current flowing into the semiconductor elements. Because of this, a cooler that cools the semiconductor elements is generally included in the power conversion device, and a refrigerant is caused to circulate on an inner side of the cooler, thereby cooling the semiconductor elements disposed in the cooler.

Due to having this kind of configuration, there is a possibility that the semiconductor elements cannot be sufficiently cooled when an abnormality occurs in the cooler or the refrigerant. Not being able to sufficiently cool the semiconductor elements results in semiconductor element breakage or power conversion device breakage, and is extremely problematic. Because of this, a function of detecting a cooling abnormality is essential in a vehicle-mounted power conversion device in order to protect a part in an interior of the power conversion device.

A power conversion device wherein refrigerant temperature detection accuracy has been improved in order to detect a cooling abnormality is known. For example, a power conversion device wherein a multiple of cooling pipes are disposed stacked, and a temperature detector is attached across a metal plate on a side of the cooling pipes opposite to that of a refrigerant entrance and exit, is disclosed in Patent Literature 1. By configuring in this way, the temperature detector is unlikely to be affected by thermal interference from a heat generating part such as a semiconductor module or a reactor, and also, thermal resistance from the temperature detector to the refrigerant decreases, because of which the refrigerant temperature can be detected accurately. This configuration is effective with respect to a gentle temperature change. For example, the configuration is effective in detecting a rise in the temperature of the refrigerant caused by an abnormal heat generation by a semiconductor module when cooling is normal, a rise in the temperature of the refrigerant caused by a stoppage of the refrigerant due to a failure of a pump that causes a liquid refrigerant to circulate, and the like.

Patent Literature 1: JP-A-2008-220042

However, there is a problem with the technology disclosed in Patent Literature 1 in that because a temperature change of the temperature detector cannot follow a temperature change when the temperature change is steep, cooling abnormality detection is late.

For example, when a refrigerant leakage occurs due to a failure of a pump that causes a liquid refrigerant to circulate or a failure of piping, and there is no longer any refrigerant in a portion of the semiconductor elements to be cooled, the temperature immediately rises locally, because a thermal capacity of the semiconductor elements is small. Meanwhile, the cooler has a large thermal capacity, the localized temperature rise is not transmitted immediately, and the temperature rises gently, meaning that by the time the temperature detector detects the abnormality, there is a possibility that the semiconductor elements are already broken.

Also, even when the semiconductor elements generate abnormal heat when a liquid refrigerant has stopped due to a pump failure, there are cases wherein, depending on an extent of abnormal heat generation, the semiconductor elements cannot be protected because the temperature detector is attached in a place unlikely to be affected by thermal interference from the semiconductor elements, and a rise in the temperature of the cooler with respect to a rise in the temperature of the semiconductor elements is gentle. In order to protect the semiconductor elements when there is a cooling abnormality in this configuration, it is necessary to provide each semiconductor element with a temperature detector, because of which the temperature detectors increase, and there is a problem in that the power conversion device increases in cost or increases in size.

SUMMARY OF THE INVENTION

The present application has been made to solve the above problem, and an object of the present application is to provide a small, low-cost power conversion device such that semiconductor element protection is enabled by detecting a cooling abnormality using one temperature detector.

A power conversion device disclosed in the present application includes a transformer having a primary winding and a secondary winding, an inverter circuit that carries out a supply of power to the primary winding, a rectifying circuit that rectifies power from the secondary winding, a cooler that cools semiconductor elements configuring the inverter circuit and semiconductor elements configuring the rectifying circuit, and a temperature detector that detects a temperature of the semiconductor elements configuring the inverter circuit and the semiconductor elements configuring the rectifying circuit, wherein the cooler has a refrigerant channel along which a refrigerant is caused to circulate, the inverter circuit, the rectifying circuit, and the temperature detector are disposed above the refrigerant channel, and the temperature detector is disposed neighboring at least either one of the inverter circuit or the rectifying circuit.

The power conversion device disclosed in the present application can protect a semiconductor element by detecting a cooling abnormality using one temperature detector, whereby a small, low-cost power conversion device is obtained.

The foregoing and other objects, features, and advantages of the present application will become more apparent from the following detailed description of the present application when taken in conjunction with the accompanying drawings.

BRIEF DESCRIPTION OF THE DRAWINGS

FIG. 5A is a plan view showing other dispositions of the inverter circuit, the temperature detector, and the rectifying circuit of the power conversion device according to the first embodiment.

FIG. 5B is a sectional view showing other dispositions of the inverter circuit, the temperature detector, and the rectifying circuit of the power conversion device according to the first embodiment.

DETAILED DESCRIPTION OF THE PREFERRED EMBODIMENTS

Figure 1:
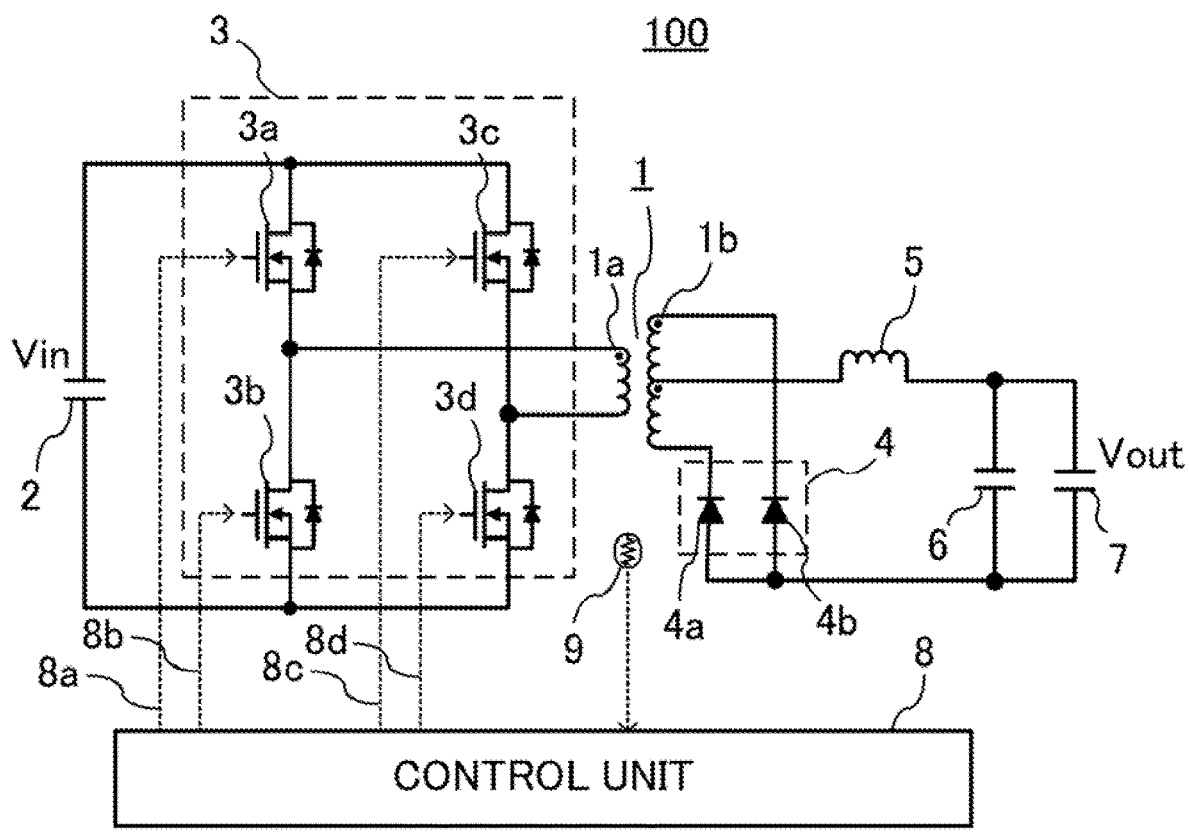
FIG. 1 is a circuit configuration drawing of a power conversion device according to a first embodiment.

Hereafter, preferred embodiments of a power conversion device according to the present application will be described using the drawings. Identical or corresponding members or regions will be illustrated in the drawings by allotting identical reference signs.

First Embodiment

FIG. 1 is a circuit configuration drawing of a power conversion device according to a first embodiment. A circuit of FIG. 1 shows an insulated DC/DC converter 100, which is a power conversion device, and is insulated by a transformer 1. The DC/DC converter 100 includes an inverter circuit (a single-phase inverter circuit is shown in the drawing) 3, wherein switching elements 3a to 3d are connected in bridge form, which is connected to a primary winding 1a of the transformer 1 and converts a direct current voltage Vin of a direct current power supply 2 into an alternating current voltage, and a rectifying circuit 4 configured of diodes 4a and 4b, which are rectifying elements, connected to a secondary winding 1b of the transformer 1. An output smoothing reactor 5 and an output capacitor 6 are connected to an output side of the rectifying circuit 4, and a direct current voltage Vout is output to a load 7. Although the power conversion device is illustrated and described as the insulated DC/DC converter 100 in the present embodiment, this is not limiting.

A control unit 8 is disposed in an exterior of a main circuit of the DC/DC converter 100, wherein the input voltage Vin and the output voltage Vout are monitored and input into the control unit 8. The control unit 8 outputs gate signals 8a to 8d to the switching elements 3a to 3d, which are semiconductor elements, controls a duty ratio (an on-state period) of the switching elements 3a to 3d, and carries out a control of pulse width modulation (PWM) in order that the output voltage Vout reaches a target value in accordance with a situation.

Also, a temperature detector 9 is disposed near the inverter circuit 3 and the rectifying circuit 4, and the control unit 8 detects a cooling abnormality using a temperature detected using the temperature detector 9, and controls the gate signals 8a to 8d, thereby limiting an output of the DC/DC converter 100 or causing an operation to stop.

The switching elements 3a to 3d, not being limited to self-arc-extinguishing semiconductor switching elements such as silicon (Si) metal-oxide-semiconductor field-effect transistors (MOSFETS), may also be wide bandgap semiconductors such as silicon carbide (SiC) or gallium nitride (GaN), or diamond-based semiconductor switching elements.

Figure 2A:
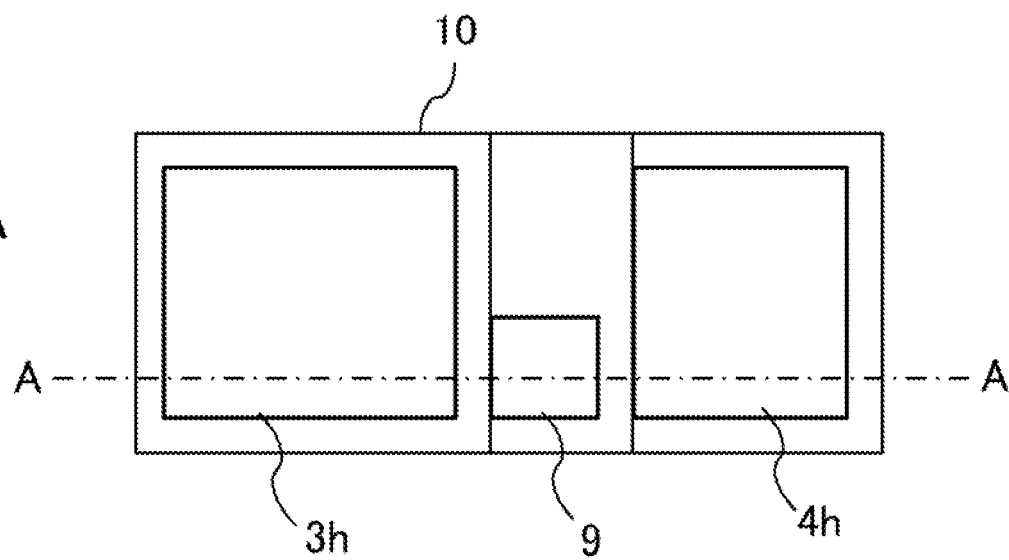
FIG. 2A is a plan view showing dispositions of an inverter circuit, a temperature detector, and a rectifying circuit of the power conversion device according to the first embodiment.
Figure 2B:
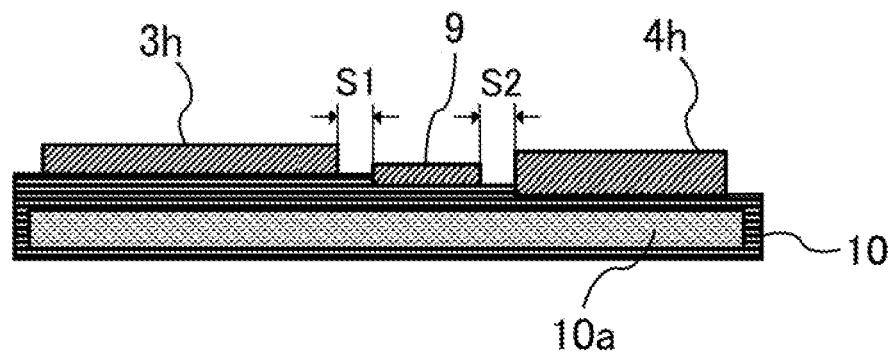
FIG. 2B is a sectional view showing dispositions of the inverter circuit, the temperature detector, and the rectifying circuit of the power conversion device according to the first embodiment.

FIGS. 2A and 2B are drawings showing dispositions of the inverter circuit 3, the rectifying circuit 4, and the temperature detector 9, wherein FIG. 2A is a plan view, and FIG. 2B is a sectional view along an A-A line of FIG. 2A.

As shown in FIGS. 2A and 2B, an inverter circuit disposition region 3h in which a semiconductor configuring the inverter circuit 3 is mounted, a rectifying circuit disposition region 4h in which a semiconductor configuring the rectifying circuit 4 is mounted, and the temperature detector 9 are all disposed in a cooler 10. The cooler 10 has a refrigerant channel 10*a*, and the refrigerant channel 10*a* is disposed directly below the inverter circuit disposition region 3*h*, the rectifying circuit disposition region 4*h*, and the temperature detector 9. Also, the temperature detector 9 is disposed in a position neighboring both the inverter circuit disposition region 3*h* and the rectifying circuit disposition region 4*h*, that is, a position neighboring both the inverter circuit 3 and the rectifying circuit 4. FIGS. 2A and 2B show a state wherein each of the inverter circuit disposition region 3*h*, the rectifying circuit disposition region 4*h*, and the temperature detector 9 is disposed in a position on a different plane of the cooler 10, and in the drawings, S1 indicates a distance between the inverter circuit disposition region 3*h* and the temperature detector 9, and S2 indicates a distance between the rectifying circuit disposition region 4*h* and the temperature detector 9.

At this point, a role of the temperature detector 9 will be described. As previously described, a function of detecting a cooling abnormality is essential in a vehicle-mounted power conversion device in order to protect a part in an interior of the power conversion device. Also, as an object is part protection, it is necessary not only to detect a cooling abnormality, but also to control the power conversion device together with the detection, thereby protecting the part. Generally, when a cooling abnormality is detected, a part is protected by an output of the power conversion device being limited, or an operation of the power conversion device being stopped. That is, ideally, both cooling abnormality detection and part protection are implemented using a temperature detected by the temperature detector 9.

As shown in FIGS. 2A and 2B, the temperature detector 9 according to the first embodiment is disposed in the cooler 10 above the refrigerant channel 10*a*, because of which a cooling abnormality such that a gentle temperature change occurs, for example, a rise in a refrigerant temperature caused by a decrease in a flow rate or a stoppage of the refrigerant due to a failure of a pump that causes a liquid refrigerant to circulate, is detected, and a part can be protected. Also, when an abnormal heat generation by the inverter circuit 3 or the rectifying circuit 4 occurs when cooling is normal, the temperature of the refrigerant rises gently, because of which the change is detected, and a part can be protected.

Figure 3A:
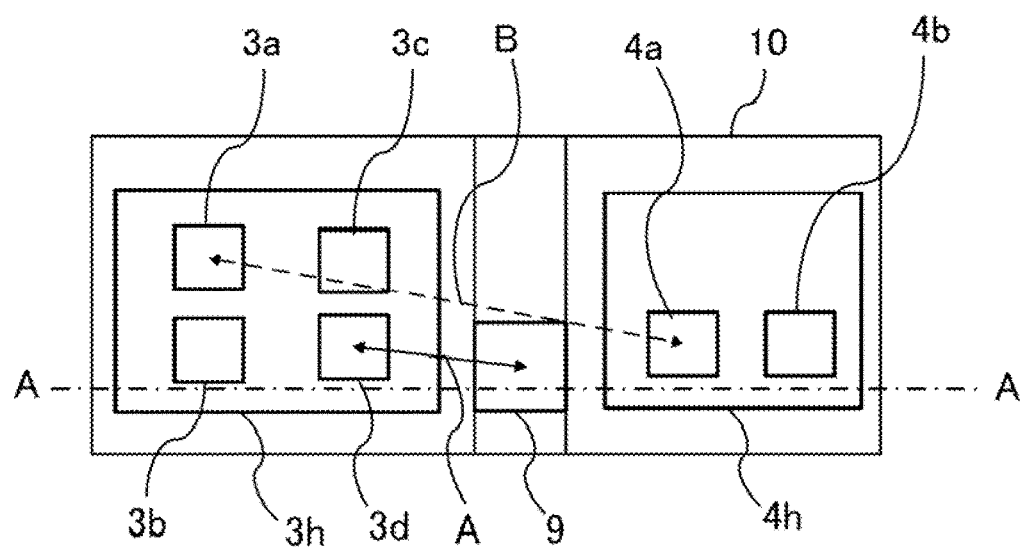
FIG. 3A is a plan view showing detailed dispositions of the inverter circuit, the temperature detector, and the rectifying circuit of the power conversion device according to the first embodiment.
Figure 3B:
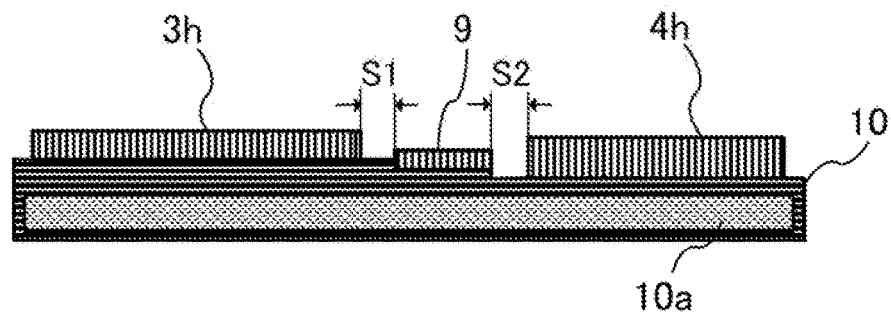
FIG. 3B is a sectional view showing detailed dispositions of the inverter circuit, the temperature detector, and the rectifying circuit of the power conversion device according to the first embodiment.
Figure 4A:
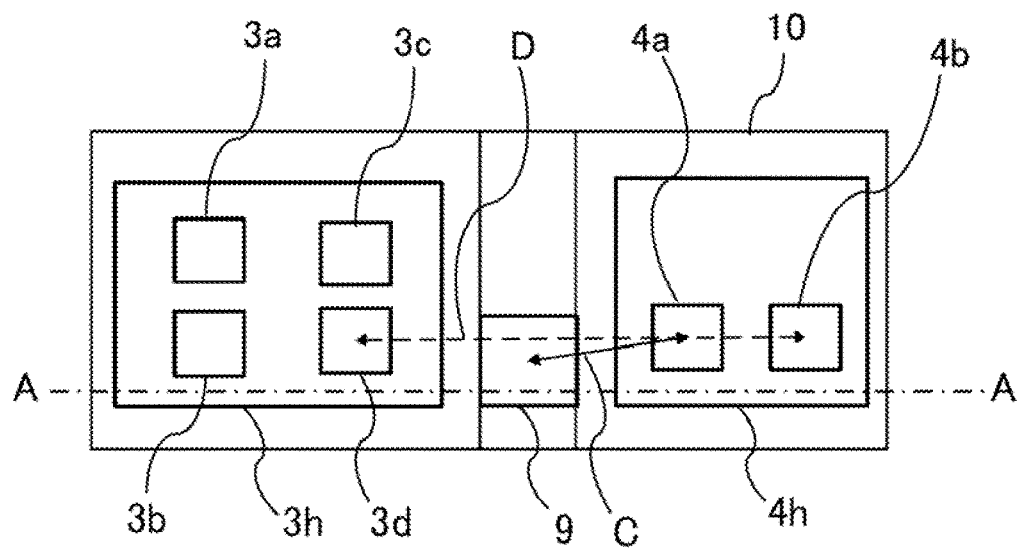
FIG. 4A is a plan view showing other detailed dispositions of the inverter circuit, the temperature detector, and the rectifying circuit of the power conversion device according to the first embodiment.
Figure 4B:
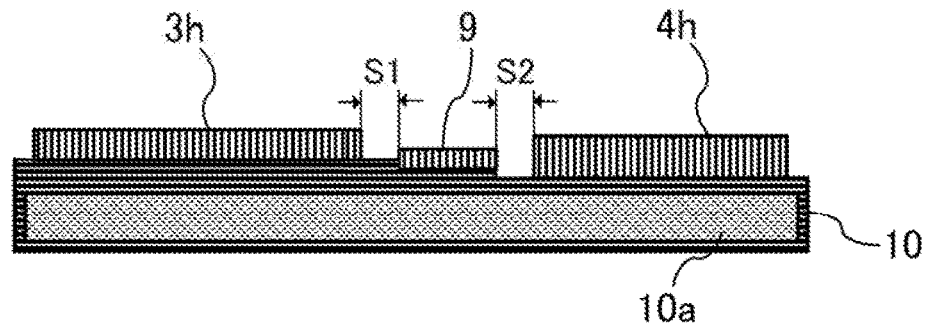
FIG. 4B is a sectional view showing other detailed dispositions of the inverter circuit, the temperature detector, and the rectifying circuit of the power conversion device according to the first embodiment.

FIGS. 3A and 3B and FIGS. 4A and 4B are detailed disposition drawings of the inverter circuit 3, the temperature detector 9, and the rectifying circuit 4, wherein FIGS. 3A and 4A are plan views, FIG. 3B is a sectional view along an A-A line of FIG. 3A, and FIG. 4B is a sectional view along an A-A line of FIG. 4A. In the same way as FIGS. 2A and 2B, FIGS. 3A and 3B and FIGS. 4A and 4B show a state wherein each of the inverter circuit disposition region 3*h*, the rectifying circuit disposition region 4*h*, and the temperature detector 9 is disposed in a position on a different plane, S1 indicates the distance between the inverter circuit disposition region 3*h* and the temperature detector 9, and S2 indicates the distance between the rectifying circuit disposition region 4*h* and the temperature detector 9.

A solid arrow A of FIG. 3A indicates a distance between the switching element 3*d*, which is the nearest of the switching elements 3*a* to 3*d* configuring the inverter circuit 3 to the temperature detector 9, and the temperature detector 9, and a broken arrow B indicates a distance between the switching element 3*a*, which is the farthest of the switching elements 3*a* to 3*d* configuring the inverter circuit 3 from the temperature detector 9, and the diode 4*a*, which is the nearer of the diodes 4*a* and 4*b* configuring the rectifying circuit 4 to the temperature detector 9.

Also, a solid arrow C of FIG. 4A indicates a distance between the diode 4*a*, which is the nearer of the diodes 4*a* and 4*b* configuring the rectifying circuit 4 to the temperature detector 9, and the temperature detector 9, and a broken arrow D indicates a distance between the diode 4*b*, which is the farther of the diodes 4*a* and 4*b* configuring the rectifying circuit 4 from the temperature detector 9, and the switching element 3*d*, which is the nearest of the switching elements 3*a* to 3*d* configuring the inverter circuit 3 to the temperature detector 9. In FIGS. 3A and 3B and FIGS. 4A and 4B, the temperature detector 9 can be disposed in a position neighboring the inverter circuit 3 and the rectifying circuit 4 by A<B and C<D being satisfied.

Also, as shown in FIGS. 2A and 2B, FIGS. 3A and 3B, and FIGS. 4A and 4B, the temperature detector 9 is disposed in the cooler 10 above the refrigerant channel 10*a*, and is disposed in a position neighboring both the inverter circuit 3 and the rectifying circuit 4, meaning that a cooling abnormality such that a steep temperature change occurs, for example, a cooling abnormality such as a refrigerant leakage caused by a failure of a pump or of piping, is detected, and a part can be protected. When a refrigerant leakage occurs, there is no longer any refrigerant in the refrigerant channel 10*a*, and the temperature of the inverter circuit 3 or the rectifying circuit 4 rises steeply. Owing to the heat spreading to the cooler 10 to which the inverter circuit 3 or the rectifying circuit 4 is attached, the temperature of the cooler 10 in which the neighboring temperature detector 9 is disposed also rises steeply, a cooling abnormality is detected immediately, and a part can be protected.

Therefore, by the inverter circuit 3, the rectifying circuit 4, and the temperature detector 9 all being disposed above the cooler 10 above the refrigerant channel 10*a*, and the temperature detector 9 being disposed in a position neighboring both the inverter circuit 3 and the rectifying circuit 4, a cooling abnormality is detected regardless of a speed of a temperature change when the cooling abnormality occurs, and a part can be protected. Also, as this can be accomplished using one temperature detector 9, the DC/DC converter 100 having a cooling abnormality detecting function can be reduced in size and reduced in cost.

Also, as shown in FIGS. 5A and 5B, the temperature detector 9 may be disposed in the same plane of the cooler 10 as both the inverter circuit 3 and the rectifying circuit 4. By disposing in this way, thermal resistance between the inverter circuit 3 and rectifying circuit 4 and the temperature detector 9 decreases, a cooling abnormality is detected more swiftly when the cooling abnormality occurs, and a part can be protected. With regard to FIGS. 5A and 5B, FIG. 5A is a plan view, and FIG. 5B is a sectional view along an A-A line of FIG. 5A.

Figure 6A:
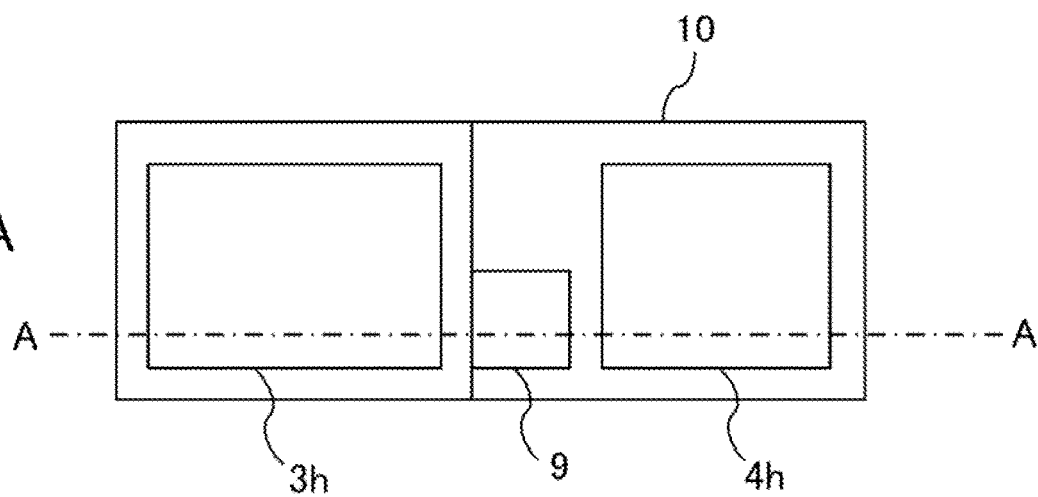
FIG. 6A is a plan view showing still other dispositions of the inverter circuit, the temperature detector, and the rectifying circuit of the power conversion device according to the first embodiment.
Figure 6B:
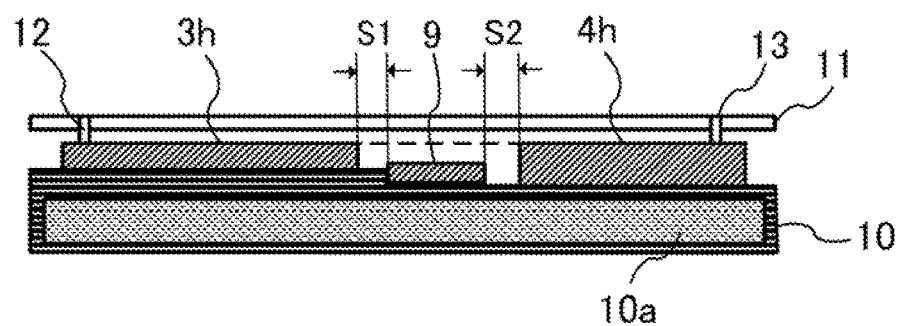
FIG. 6B is a sectional view showing still other dispositions of the inverter circuit, the temperature detector, and the rectifying circuit of the power conversion device according to the first embodiment.

Also, as shown in FIGS. 6A and 6B, the temperature detector 9 may be disposed in the same plane of the cooler 10 as either one of the inverter circuit 3 or the rectifying circuit 4. In FIGS. 6A and 6B, the temperature detector 9 is disposed in the same plane of the cooler 10 as the rectifying circuit 4. This means that when, for example, the inverter circuit 3 and the rectifying circuit 4 are to be connected to the same substrate 11, and a difference in part sizes is absorbed by the cooler 10 in order to unify heights of sides to be connected to the substrate 11, heights of faces of the cooler 10 on which the inverter circuit 3 and the rectifying circuit 4 are disposed are different. In this case, by a face of the cooler 10 on which the circuit, of the inverter circuit 3 and the rectifying circuit 4, whose rise in temperature is earlier when a cooling abnormality occurs, and which reaches a rated temperature of the semiconductor elements configuring the circuit earlier, is disposed and a face on which the temperature detector 9 is disposed being the same, the thermal resistance between the circuit that needs the earlier protection and the temperature detector 9 decreases, and a part can be protected. Herein, FIG. 6A is a plan view, and FIG. 6B is a sectional view along an A-A line of FIG. 6A. Also reference sign 12 of FIG. 6B indicates a place in which the substrate 11 and the inverter circuit 3 are connected, and reference sign 13 indicates a place in which the substrate 11 and the rectifying circuit 4 are connected.

Figure 7A:
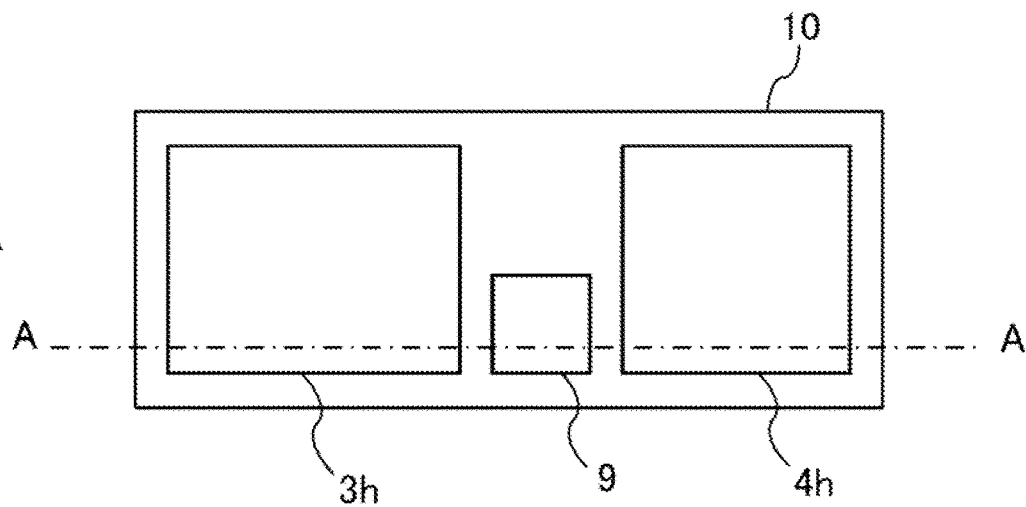
FIG. 7A is a plan view showing still other dispositions of the inverter circuit, the temperature detector, and the rectifying circuit of the power conversion device according to the first embodiment.
Figure 7B:
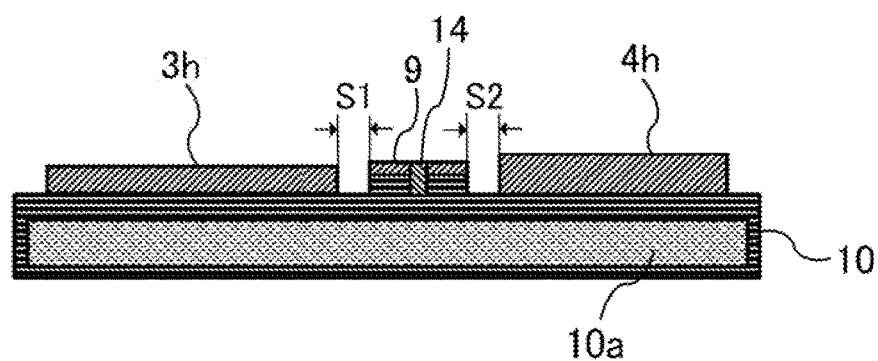
FIG. 7B is a sectional view showing still other dispositions of the inverter circuit, the temperature detector, and the rectifying circuit of the power conversion device according to the first embodiment.

Also, as shown in FIG. 7A and FIG. 7B, the temperature detector 9 may be disposed in a high position in the cooler 10 with respect to the inverter circuit 3 and the rectifying circuit 4. This is, for example, a configuration such that a thickness of the cooler 10 is secured because the temperature detector 9 is a thermistor screw-fixed using a screw 14 in consideration of ease of mounting, the cooler 10 between the inverter circuit 3 and rectifying circuit 4 and the refrigerant channel 10a is thin, and the thermal resistance between the inverter circuit 3 and rectifying circuit 4 and the refrigerant channel 10a is reduced. This is effective when a refrigerant temperature setting is high, and there is a need to reduce the thermal resistance when cooling is normal. Herein, FIG. 7A is a plan view, and FIG. 7B is a sectional view along an A-A line of FIG. 7A.

Figure 8A:
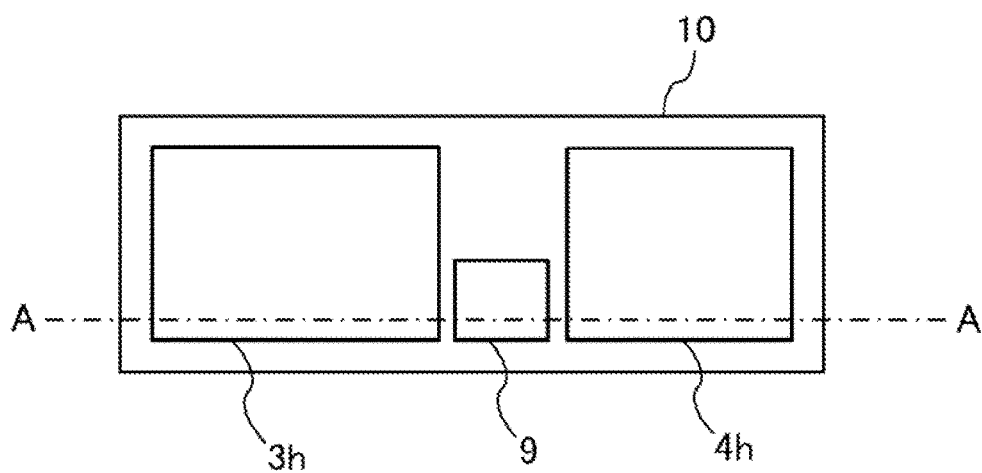
FIG. 8A is a plan view showing still other dispositions of the inverter circuit, the temperature detector, and the rectifying circuit of the power conversion device according to the first embodiment.
Figure 8B:
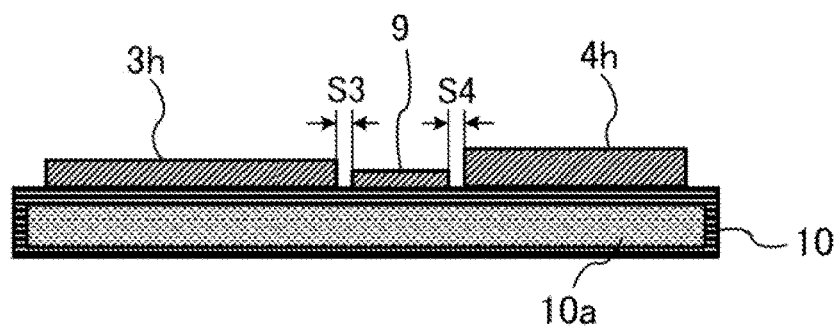
FIG. 8B is a sectional view showing still other dispositions of the inverter circuit, the temperature detector, and the rectifying circuit of the power conversion device according to the first embodiment.

Also, FIGS. 8A and 8B are drawings wherein a package of semiconductor elements configuring each of the inverter circuit 3 and the rectifying circuit 4 is an insulated package, and the temperature detector 9 is disposed still nearer to the inverter circuit 3 and the rectifying circuit 4 than in the dispositions shown in FIGS. 2A and 2B, FIGS. 5A and 5B, FIGS. 6A and 6B, and FIGS. 7A and 7B. When the semiconductor elements are not an insulated package, the temperature detector 9 needs to be disposed after securing a creepage distance necessary for insulation from a semiconductor element package conductive portion. Because of this, distances between the inverter circuit 3 and rectifying circuit 4 and the temperature detector 9 are restricted by a creepage distance over which insulation can be secured. By using an insulated package, the restriction of the creepage distance over which insulation can be secured is eliminated, and the inverter circuit 3 and rectifying circuit 4 and the temperature detector 9 can be disposed still nearer to each other. As a result of this, the thermal resistance further decreases, a cooling abnormality is detected still more swiftly when the cooling abnormality occurs, and a part can be protected. Herein, FIG. 8A is a plan view, and FIG. 8B is a sectional view along an A-A line of FIG. 8A. Also, in FIG. 8B, S3 is a distance between the temperature detector 9 and the inverter circuit disposition region 3h when the package of semiconductor elements is an insulated package, S4 indicates a distance between the temperature detector 9 and the rectifying circuit disposition region 4h when the package of semiconductor elements is an insulated package, S1>S3, and S2>S4.

Figure 9:
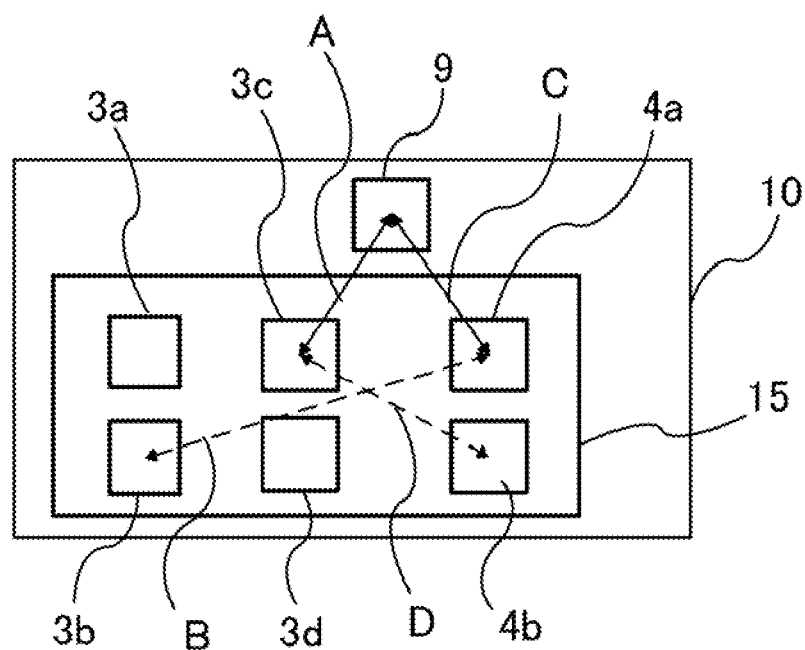
FIG. 9 is still another disposition drawing of the inverter circuit, the temperature detector, and the rectifying circuit of the power conversion device according to the first embodiment.

Also, FIG. 9 is a disposition drawing of a case wherein the switching elements 3a to 3d of the inverter circuit 3 and the diodes 4a and 4b of the rectifying circuit 4 are an integrated module 15. Owing to the inverter circuit 3 and the rectifying circuit 4 being the integrated module 15, the disposition regions of the inverter circuit 3 and the rectifying circuit 4 become smaller, and the DC/DC converter 100 can be reduced in size. Also, in a case wherein the inverter circuit 3 and the rectifying circuit 4 are the integrated module 15 too, the temperature detector 9 can be disposed in a position neighboring both the inverter circuit 3 and the rectifying circuit 4 by A<B and C<D being satisfied, because of which a cooling abnormality is detected, and a part can be protected.

Figure 10:
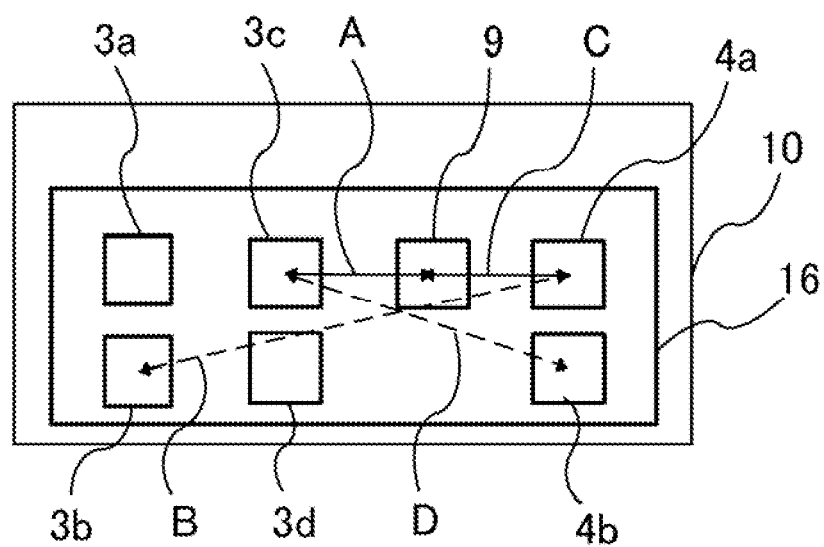
FIG. 10 is still another disposition drawing of the inverter circuit, the temperature detector, and the rectifying circuit of the power conversion device according to the first embodiment.

Also, FIG. 10 is a disposition drawing of a case wherein the switching elements 3a to 3d configuring the inverter circuit 3, the diodes 4a and 4b configuring the rectifying circuit 4, and the temperature detector 9 are an integrated module 16. Owing to the inverter circuit 3, the rectifying circuit 4, and the temperature detector 9 being the integrated module 16, a chip thermistor can be applied as the temperature detector 9, and the disposition regions of the inverter circuit 3, the rectifying circuit 4, and the temperature detector 9 become considerably smaller, because of which the DC/DC converter 100 can be reduced in size. Also, in a case wherein the inverter circuit 3, the rectifying circuit 4, and the temperature detector 9 are the integrated module 16 too, the temperature detector 9 can be disposed in a position neighboring both the inverter circuit 3 and the rectifying circuit 4 by A<B and C<D being satisfied, because of which a cooling abnormality is detected, and a part can be protected.

Second Embodiment

Next, a power conversion device according to a second embodiment will be described.

As a circuit configuration of the power conversion device according to the second embodiment is the same as that in the first embodiment, a description will be omitted. In the second embodiment, however, differing from the first embodiment, a temperature detector is disposed in a position neighboring either an inverter circuit or a rectifying circuit.

A vehicle-mounted power conversion device is such that there is a strong demand for a reduction in size (an increase in power density) accompanying a promotion of vehicle electrification. Because of this, freedom of layout of a cooler or part disposition in a power conversion device interior is decreasing, and a temperature detector cannot necessarily be disposed neighboring both an inverter circuit and a rectifying circuit, as is the case in the first embodiment.

Figure 11A:
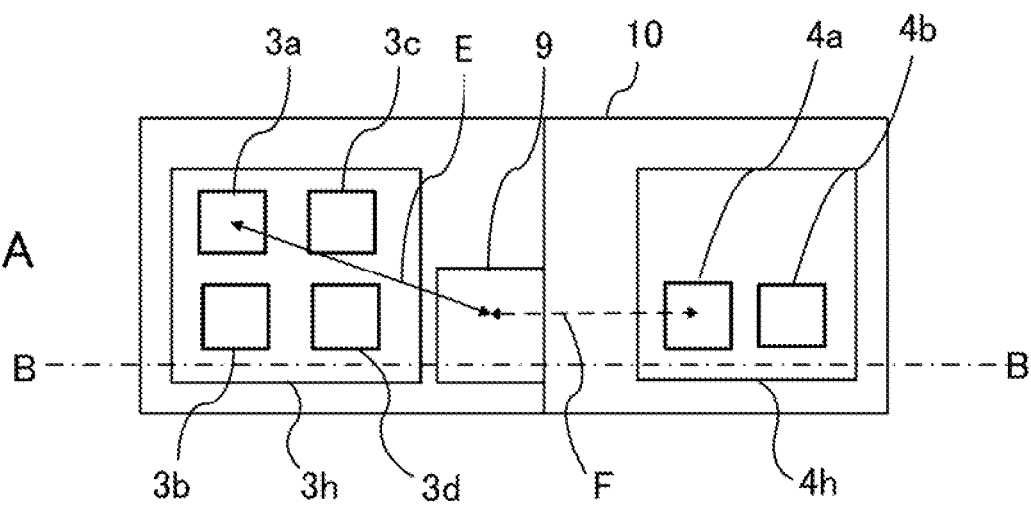
FIG. 11A is a plan view showing detailed dispositions of an inverter circuit, a temperature detector, and a rectifying circuit of a power conversion device according to a second embodiment.
Figure 11B:
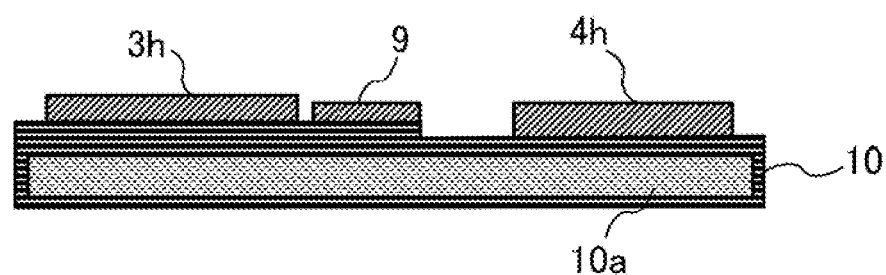
FIG. 11B is a sectional view showing detailed dispositions of the inverter circuit, the temperature detector, and the rectifying circuit of the power conversion device according to the second embodiment.
Figure 12A:
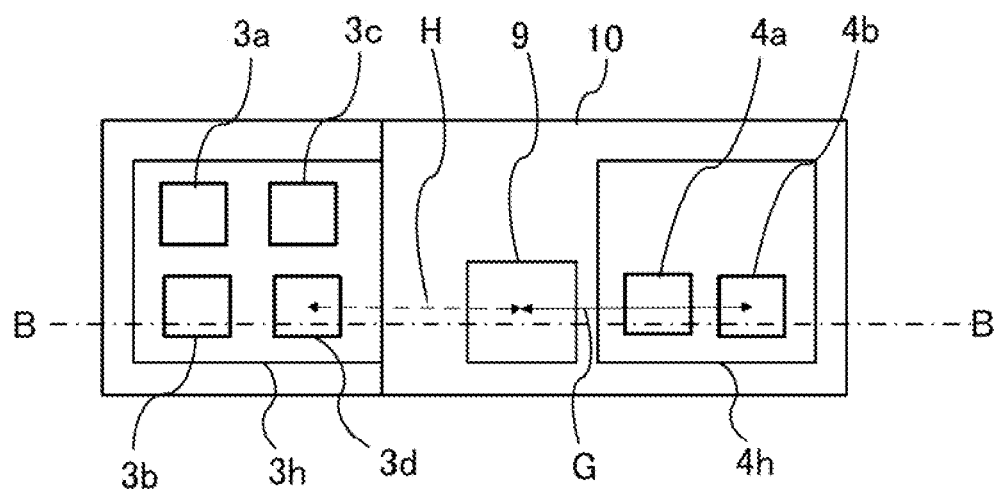
FIG. 12A is a plan view showing detailed dispositions of the inverter circuit, the temperature detector, and the rectifying circuit of the power conversion device according to the second embodiment.
Figure 12B:
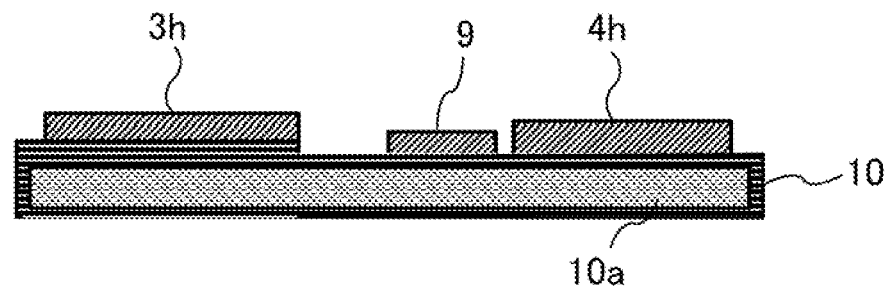
FIG. 12B is a sectional view showing detailed dispositions of the inverter circuit, the temperature detector, and the rectifying circuit of the power conversion device according to the second embodiment.

FIGS. 11A and 11B and FIGS. 12A and 12B are disposition drawings of the inverter circuit 3, the rectifying circuit 4, and the temperature detector 9 according to the second embodiment, wherein FIGS. 11A and 12A are plan views, FIG. 11B is a sectional view along a B-B line of FIG. 11A, and FIG. 12B is a sectional view along a B-B line of FIG. 12A. A solid arrow E of FIG. 11A indicates a distance between the switching element 3a, which is the farthest of the switching elements 3a to 3d configuring the inverter circuit 3 from the temperature detector 9, and the temperature detector 9, and a broken arrow F indicates a distance between the diode 4a, which is the nearer of semiconductor elements, the diodes 4a and 4b for example, configuring the rectifying circuit 4 to the temperature detector 9, and the temperature detector 9.

Also, a solid arrow G of FIG. 12A indicates a distance between the diode 4b, which is the farther of the diodes 4a and 4b configuring the rectifying circuit 4 from the temperature detector 9, and the temperature detector 9, and a broken arrow H indicates a distance between the switching element 3d, which is the nearest of the switching elements 3a to 3d configuring the inverter circuit 3 to the temperature detector 9, and the temperature detector 9. In FIGS. 11A and 11B and FIGS. 12A and 12B, the temperature detector 9 can be disposed in a position neighboring the inverter circuit 3 or the rectifying circuit 4 by E<F or G<H being satisfied.

Herein, when a vehicle-mounted power conversion device is assumed to be a step-down DC/DC converter that carries out power conversion from a high pressure battery (a lithium-ion battery) to an auxiliary battery (a lead battery), the auxiliary battery is a 12V battery, and output voltage specifications of the step-down DC/DC converter are practically unchanging. Meanwhile, current specifications of the auxiliary battery (output current specifications of the step-down DC/DC converter) and voltage specifications of the high pressure battery (input voltage specifications of the step-down DC/DC converter) differ in accordance with a vehicle maker or a vehicle type, and are of a wide variety, with a current range being in the region of, for example, a lower limit of about 100 A and an upper limit of about 200 A, and a voltage range being in the region of, for example, a lower limit of about 100V and an upper limit of about 800V.

When responding to a change in these specifications without changing the semiconductor elements configuring the inverter circuit 3 and the rectifying circuit 4, losses in individual semiconductor elements vary greatly. For example, when the input voltage specification changes from 400V to 200V while the output voltage and output current specifications are unchanging, the input voltage decreases by half and output power is unchanging, because of which the input current doubles, and a value of current flowing into the semiconductor elements configuring the inverter circuit 3 doubles. When the current value doubles, conduction loss increases by four times (conduction loss on-state resistance value×current value squared), because of which loss in the semiconductor elements configuring the inverter circuit 3 increases considerably. When a cooling abnormality occurs in such a case, it is necessary to protect the semiconductor elements configuring the inverter circuit 3 before the semiconductor elements configuring the rectifying circuit 4, because of which the temperature detector 9 is disposed neighboring the inverter circuit 3, as in FIGS. 11A and 11B, whereby the cooling abnormality is detected, and a part can be protected.

Also, for example, when the output voltage specifications are unchanging, the output current specification changes from 100 A to 200 A, and the input voltage specification changes from 200V to 400V, the output current specification doubles (from 100 A to 200 A), because of which conduction loss in the semiconductor elements configuring the rectifying circuit 4 doubles (conduction loss=VF forward voltage×current value, wherein the semiconductor elements are assumed to be diodes), because of which loss in the semiconductor elements configuring the rectifying circuit 4 increases considerably. Meanwhile, the current flowing into the semiconductor elements configuring the inverter circuit 3 doubles due to the output current specification doubling, and is halved due to the input voltage specification doubling (from 200V to 400V), because of which the current is practically unchanged. When a cooling abnormality occurs in such a case, it is necessary to protect the semiconductor elements configuring the rectifying circuit 4 before the semiconductor elements configuring the inverter circuit 3, because of which the temperature detector 9 is disposed neighboring the rectifying circuit 4, as in FIGS. 12A and 12B, whereby the cooling abnormality is detected, and a part can be protected.

In the heretofore described examples, changes in input and output voltage specifications of a power conversion device have been described, but even when losses, thermal resistances, rated junction temperatures, or the like, of the semiconductor elements configuring the inverter circuit 3 and the semiconductor elements configuring the rectifying circuit 4 differ considerably, a cooling abnormality is detected, and a part can be protected, by the temperature detector 9 being disposed in a position neighboring the inverter circuit 3 or the rectifying circuit 4 in the same way.

Also, in the heretofore described examples, an example wherein the inverter circuit 3, the rectifying circuit 4, and the temperature detector 9 are mounted directly on the cooler 10 has been described, but a configuration wherein a frame having good thermal conductivity, such as a metal frame, is disposed on the cooler 10, and the inverter circuit 3, the rectifying circuit 4, and the temperature detector 9 are mounted on the frame, that is, the inverter circuit 3, the rectifying circuit 4, and the temperature detector 9 are disposed on the cooler 10 across the frame, may be adopted, and an equivalent advantage can be obtained.

Although the present application is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the embodiments.

It is therefore understood that numerous modifications which have not been exemplified can be devised without departing from the scope of the present application. For example, at least one constituent component may be modified, added, or eliminated. At least one of the constituent components mentioned in at least one of the preferred embodiments may be selected and combined with the constituent components mentioned in another preferred embodiment. For, example, the present invention is also applicable when grease, an insulating sheet, or the like is interposed between the contact surfaces of the semiconductor elements and the cooler, when the fixing method is screwing or spring locking, when the rectifying elements are not diodes, but are switching elements, or when the refrigerant is a gas.

Hereafter, aspects of the present disclosure will be described collectively as appendices.

APPENDIX 1

A power conversion device characterized by including a transformer having a primary winding and a secondary winding, an inverter circuit that carries out a supply of power to the primary winding, a rectifying circuit that rectifies power from the secondary winding, a cooler that cools semiconductor elements configuring the inverter circuit and semiconductor elements configuring the rectifying circuit, and a temperature detector that detects a temperature of the semiconductor elements configuring the inverter circuit and the semiconductor elements configuring the rectifying circuit, wherein the cooler has a refrigerant channel along which a refrigerant is caused to circulate, the inverter circuit, the rectifying circuit, and the temperature detector are disposed above the refrigerant channel, and the temperature detector is disposed neighboring at least either one of the inverter circuit or the rectifying circuit.

APPENDIX 2

The power conversion device described in Appendix 1, characterized in that the inverter circuit and the rectifying circuit include a multiple of semiconductor elements, the inverter circuit includes a first semiconductor element whose distance to the temperature detector is shortest and a second semiconductor element whose distance to the temperature detector is longest among the multiple of semiconductor elements included in the inverter circuit, the rectifying circuit includes a third semiconductor element whose distance to the temperature detector is shortest and a fourth semiconductor element whose distance to the temperature detector is longest among the multiple of semiconductor elements included in the rectifying circuit, a distance between the first semiconductor element and the temperature detector is shorter than a distance between the second semiconductor element and the third semiconductor element, and a distance between the third semiconductor element and the temperature detector is shorter than a distance between the first semiconductor element and the fourth semiconductor element.

APPENDIX 3

The power conversion device described in Appendix 1, characterized in that the inverter circuit and the rectifying circuit include a multiple of semiconductor elements, the inverter circuit includes a first semiconductor element whose distance to the temperature detector is shortest and a second semiconductor element whose distance to the temperature detector is longest among the multiple of semiconductor elements included in the inverter circuit, the rectifying circuit includes a third semiconductor element whose distance to the temperature detector is shortest and a fourth semiconductor element whose distance to the temperature detector is longest among the multiple of semiconductor elements included in the rectifying circuit, and a distance between the first semiconductor element and the temperature detector is longer than a distance between the fourth semiconductor element and the temperature detector, or a distance between the third semiconductor element and the temperature detector is longer than a distance between the second semiconductor element and the temperature detector.

APPENDIX 4

The power conversion device described in Appendix 3, characterized in that the temperature detector is neighboring a circuit that includes a semiconductor element, among the multiple of semiconductor elements included in the inverter circuit and the rectifying circuit, whose junction temperature when cooling is normal is nearest to a rated junction temperature.

APPENDIX 5

The power conversion device described in any one of Appendices 1 to 4, characterized in that the temperature detector is disposed in the same plane as at least either one of the inverter circuit or the rectifying circuit.

APPENDIX 6

The power conversion device described in any one of Appendices 1 to 4, characterized in that the temperature detector is disposed on a high face with respect to faces on which the inverter circuit and the rectifying circuit are disposed.

APPENDIX 7

The power conversion device described in any one of Appendices 1 to 6, characterized in that the temperature detector is a thermistor fixed by screwing.

APPENDIX 8

The power conversion device described in any one of Appendices 1 to 7, characterized in that the semiconductor elements configuring the inverter circuit are configured of an insulated package.

APPENDIX 9

The power conversion device described in any one of Appendices 1 to 8, characterized in that the inverter circuit and the rectifying circuit are configured of an integrated module.

APPENDIX 10

The power conversion device described in any one of Appendices 1 to 6 and 8, characterized in that the inverter circuit, the rectifying circuit, and the temperature detector are configured of an integrated module.

APPENDIX 11

The power conversion device described in any one of Appendices 1 to 10, characterized in that the refrigerant is a liquid.

What is claimed is:
1. A power conversion device, comprising:
a transformer having a primary winding and a secondary winding;
an inverter circuit that carries out a supply of power to the primary winding;
a rectifying circuit that rectifies power from the secondary winding;
a cooler that cools semiconductor elements configuring the inverter circuit and semiconductor elements configuring the rectifying circuit;
and a temperature detector that detects a temperature of the semiconductor elements configuring the inverter circuit and the semiconductor elements configuring the rectifying circuit, wherein
the cooler has a refrigerant channel along which a refrigerant is caused to circulate,
the inverter circuit, the rectifying circuit, and the temperature detector are disposed above the refrigerant channel when viewed in a cross-section,
and the temperature detector is disposed between or beside the inverter circuit and the rectifier circuit when viewed in a plan and is neighboring at least either one of the inverter circuit or the rectifying circuit,
wherein the inverter circuit and the rectifying circuit include a multiple of semiconductor elements, the inverter circuit includes a first semiconductor element whose distance to the temperature detector is shortest and a second semiconductor element whose distance to the temperature detector is longest among the multiple of semiconductor elements included in the inverter circuit,
the rectifying circuit includes a third semiconductor element whose distance to the temperature detector is shortest and a fourth semiconductor element whose distance to the temperature detector is longest among the multiple of semiconductor elements included in the rectifying circuit,
a distance between the first semiconductor element and the temperature detector is shorter than a distance between the second semiconductor element and the third semiconductor element, and a distance between the third semiconductor element and the temperature detector is shorter than a distance between the first semiconductor element and the fourth semiconductor element.

2. The power conversion device according to claim 1, wherein the temperature detector is disposed in the same plane as at least either one of the inverter circuit or the rectifying circuit.

3. The power conversion device according to claim 1, wherein the temperature detector is disposed on a high face with respect to faces on which the inverter circuit and the rectifying circuit are disposed.

4. The power conversion device according to claim 1, wherein the temperature detector is a thermistor fixed by screwing.

5. The power conversion device according to claim 1, wherein the semiconductor elements configuring the inverter circuit are configured of an insulated package.

6. The power conversion device according to claim 1, wherein the inverter circuit and the rectifying circuit are configured of an integrated module.

7. The power conversion device according to claim 1, wherein the inverter circuit, the rectifying circuit, and the temperature detector are configured of an integrated module.

8. The power conversion device according to claim 1, wherein the refrigerant is a liquid.

9. The power conversion device according to claim 1, wherein the temperature detector is disposed in the same plane as at least either one of the inverter circuit or the rectifying circuit.

10. The power conversion device according to claim 1, wherein the temperature detector is disposed on a high face with respect to faces on which the inverter circuit and the rectifying circuit are disposed.

11. The power conversion device according to claim 1 wherein the temperature detector is a thermistor fixed by screwing.

12. The power conversion device according to claim 1, wherein the semiconductor elements configuring the inverter circuit are configured of an insulated package.

13. The power conversion device according to claim 1, wherein the inverter circuit and the rectifying circuit are configured of an integrated module.

14. The power conversion device according to claim 1, wherein the inverter circuit, the rectifying circuit, and the temperature detector are configured of an integrated module.

15. The power conversion device according to claim 1, wherein the refrigerant is a liquid.

16. A power conversion device, comprising:
a transformer having a primary winding and a secondary winding;
an inverter circuit that carries out a supply of power to the primary winding;
a rectifying circuit that rectifies power from the secondary winding;
a cooler that cools semiconductor elements configuring the inverter circuit and semiconductor elements configuring the rectifying circuit;
and a temperature detector that detects a temperature of the semiconductor elements configuring the inverter circuit and the semiconductor elements configuring the rectifying circuit, wherein
the cooler has a refrigerant channel along which a refrigerant is caused to circulate,
the inverter circuit, the rectifying circuit, and the temperature detector are disposed above the refrigerant channel when viewed in a cross-section,
and the temperature detector is disposed between or beside the inverter circuit and the rectifier circuit when viewed in a plan and is neighboring at least either one of the inverter circuit or the rectifying circuit, wherein the inverter circuit and the rectifying circuit include a multiple of semiconductor elements, the inverter circuit includes a first semiconductor element whose distance to the temperature detector is shortest and a second semiconductor element whose distance to the temperature detector is longest among the multiple of semiconductor elements included in the inverter circuit
the rectifying circuit includes a third semiconductor element whose distance to the temperature detector is shortest and a fourth semiconductor element whose distance to the temperature detector is longest among the multiple of semiconductor elements included in the rectifying circuit,
and a distance between the first semiconductor element and the temperature detector is longer than a distance between the fourth semiconductor element and the temperature detector, or a distance between the third semiconductor element and the temperature detector is longer than a distance between the second semiconductor element and the temperature detector.

17. The power conversion device according to claim 16, wherein the temperature detector is neighboring a circuit that includes a semiconductor element, among the multiple of semiconductor elements included in the inverter circuit and the rectifying circuit, whose junction temperature when cooling is normal is nearest to a rated junction temperature.

18. A power conversion device, comprising:
a transformer having a primary winding and a secondary winding;
an inverter circuit that carries out a supply of power to the primary winding;
a rectifying circuit that rectifies power from the secondary winding;
a cooler that cools semiconductor elements configuring the inverter circuit and semiconductor elements configuring the rectifying circuit;
and a temperature detector that detects a temperature of the semiconductor elements configuring the inverter circuit and the semiconductor elements configuring the rectifying circuit, wherein
the cooler has a refrigerant channel along which a refrigerant is caused to circulate,
the inverter circuit, the rectifying circuit, and the temperature detector are disposed above the refrigerant channel,
the inverter circuit includes a first semiconductor element whose first distance to the temperature detector is shortest and a second semiconductor element whose second distance to the temperature detector is longest among the semiconductor elements of the inverter circuit,
the rectifying circuit includes a third semiconductor element whose third distance to the temperature detector is shortest and a fourth semiconductor element whose fourth distance to the temperature detector is longest among the semiconductor elements of the rectifying circuit,
and
the temperature detector is disposed neighboring at least either one of the inverter circuit or the rectifying circuit by comparing the first distance with a distance between the second and the third semiconductor element, and the third distance with a distance between the first and the fourth semiconductor element, or one of the first and the third distance with one of the fourth and the second distance, respectively.

\* \* \* \* \*